United States Patent
Yu et al.

(10) Patent No.: US 8,629,465 B2
(45) Date of Patent: Jan. 14, 2014

(54) LIGHT-EMITTING DIODES ON CONCAVE TEXTURE SUBSTRATE

(75) Inventors: Chen-Hua Yu, Hsin-Chu (TW);
Hung-Ta Lin, Hsin-Chu (TW);
Wen-Chih Chiou, Miaoli (TW);
Ding-Yuan Chen, Taichung (TW);
Chia-Lin Yu, Sigang (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/358,327

(22) Filed: Jan. 25, 2012

(65) Prior Publication Data

US 2012/0119236 A1    May 17, 2012

Related U.S. Application Data

(62) Division of application No. 12/247,895, filed on Oct. 8, 2008, now Pat. No. 8,134,163.

(60) Provisional application No. 61/087,897, filed on Aug. 11, 2008.

(51) Int. Cl.
*H01L 33/08* (2010.01)

(52) U.S. Cl.
USPC ............... 257/88; 257/E27.121; 257/E33.006

(58) Field of Classification Search
CPC ..... H01L 27/15; H01L 27/153; H01L 27/156; H01L 33/20; H01L 33/24
USPC .............................. 257/88, E27.121, E33.006
See application file for complete search history.

(56) References Cited

U.S. PATENT DOCUMENTS

| 5,930,279 | A | 7/1999 | Apollonov et al. |
| 6,531,328 | B1 | 3/2003 | Chen |
| 6,635,901 | B2 | 10/2003 | Sawaki et al. |

(Continued)

FOREIGN PATENT DOCUMENTS

| CN | 1638162 A | | 7/2005 |
| JP | 10223368 A | * | 8/1998 |
| JP | 2002026387 A | | 1/2002 |

OTHER PUBLICATIONS

Lee, S.C., et al., "Nanoscale Spatial Phase Modulation of GaN on a V-Grooved Si Substrate-Cubic Phase GaN on Si(001) for Monolithic Integration," IEEE Journal of Quantum Electronics, vol. 41, No. 4, Apr. 2005, pp. 596-605.

(Continued)

*Primary Examiner* — Yu Chen
(74) *Attorney, Agent, or Firm* — Slater & Matsil, L.L.P.

(57) ABSTRACT

A semiconductor device having light-emitting diodes (LEDs) formed on a concave textured substrate is provided. A substrate is patterned and etched to form recesses. A separation layer is formed along the bottom of the recesses. An LED structure is formed along the sidewalls and, optionally, along the surface of the substrate between adjacent recesses. In these embodiments, the surface area of the LED structure is increased as compared to a planar surface. In another embodiment, the LED structure is formed within the recesses such that the bottom contact layer is non-conformal to the topology of the recesses. In these embodiments, the recesses in a silicon substrate result in a cubic structure in the bottom contact layer, such as an n-GaN layer, which has a non-polar characteristic and exhibits higher external quantum efficiency.

19 Claims, 12 Drawing Sheets

(56) References Cited

U.S. PATENT DOCUMENTS

| | | |
|---|---|---|
| 6,844,572 B2 | 1/2005 | Sawaki et al. |
| 2002/0055198 A1* | 5/2002 | Kim et al. ............... 438/42 |
| 2003/0178702 A1* | 9/2003 | Sawaki et al. ............ 257/622 |
| 2005/0145862 A1 | 7/2005 | Kim et al. |
| 2007/0145382 A1 | 6/2007 | Choi et al. |
| 2008/0308835 A1 | 12/2008 | Pan |
| 2009/0032799 A1 | 2/2009 | Pan |

OTHER PUBLICATIONS

"Nonpolar and semipolar GaN LEDs show great improvement," LEDs Magazine, Dec. 19, 2006, 2 pgs.

* cited by examiner

LIGHT-EMITTING DIODES ON CONCAVE TEXTURE SUBSTRATE

This application is a divisional of U.S. patent application Ser. No. 12/247,895, filed on Oct. 8, 2008, entitled "Light-Emitting Diodes on Concave Texture Substrate," which claims the benefit of U.S. Provisional Application Ser. No. 61/087,897, filed on Aug. 11, 2008, entitled "Light-Emitting Diodes on Concave Texture Substrate;" which applications are hereby incorporated herein by reference in their entireties.

TECHNICAL FIELD

This invention relates generally to light-emitting diodes and, more particularly, to light-emitting diodes formed in recesses of a substrate.

BACKGROUND

Light emitting diodes (LEDs) are manufactured by forming active regions on a substrate and by depositing various conductive and semiconductive layers on the substrate. The radiative recombination of electron-hole pairs can be used for the generation of electromagnetic radiation (e.g., light) by the electric current in a p-n junction. In a forward-biased p-n junction fabricated from a direct band gap material, such as GaAs or GaN, the recombination of the electron-hole pairs injected into the depletion region causes the emission of electromagnetic radiation. The electromagnetic radiation may be in the visible range or may be in a non-visible range. Different colors of LEDs may be created by using materials with different band gaps. Further, an LED with electromagnetic radiation emitting in a non-visible range may direct the non-visible light towards a phosphor lens or a like material type. When the non-visible light is absorbed by the phosphor, the phosphor emits a visible light.

LEDs are typically manufactured on a sapphire substrate ($Al_2O_3$) for group III-N compound LED structures because the crystal orientation of the sapphire substrate allows the group III-N compounds to be epitaxially grown on the sapphire substrate. Sapphire substrates, however, are expensive as compared to silicon substrates. Also, sapphire substrates are typically characterized by thermal accumulation due to the low thermal conductivity of sapphire.

Furthermore, LEDs are typically formed on a planar substrate, thereby resulting in a planar LED structure. A planar LED structure limits the amount of light-emitting material that may be placed on a given size of substrate. As a result, the light emitting efficiency of an LED of a given size is restricted.

Accordingly, there is a need for a structure and a method to form LED devices more cost effectively while increasing the light emitting efficiency of an LED of a given size.

SUMMARY OF THE INVENTION

These and other problems are generally reduced, solved or circumvented, and technical advantages are generally achieved, by embodiments of the present invention, which provides light-emitting diodes (LEDs) formed in recesses of a substrate.

In an embodiment of the present invention, a method of forming an LED device is provided. The method includes forming recesses in a substrate and forming LED structures within the recesses. The LED structures may have a bottom contact layer that covers the sidewalls of the recesses. The LED structure includes the bottom contact layer, an active layer (e.g., a multiple quantum well), and a top contact layer. Optionally, a buffer layer may be used to facilitate the growth of the bottom contact layer on the substrate. Furthermore, the LED structure may be formed over a top surface of the substrate adjacent to the recesses.

In another embodiment of the present invention, an LED device is provided. The LED device includes LED structures in recesses of a substrate such that the LED structures cover the sidewalls of the recesses. The LED structure may be formed as conformal layers along sidewalls of the recesses, and optionally over a top surface of the substrate adjacent to the recesses.

In yet another embodiment of the present invention, another LED device is provided. The LED structure includes a bottom contact layer that has a non-conformal, and preferably a planar, surface as compared to the topology of the recess. The active layer and the top contact layer may be formed as conformal layers over the bottom contact layer.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed herein are merely illustrative of specific ways to make and use the invention, and do not limit the scope of the invention.

A novel method for forming light-emitting diodes (LEDs) and the resulting structures are provided. The intermediate stages of manufacturing preferred embodiments of the present invention are illustrated. It should be understood that steps necessary to illustrate the inventive aspects of the invention are shown, but other processes may be performed. Throughout the various views and illustrative embodiments of the present invention, like reference numbers are used to designate like elements.

FIGS. 1a-1f illustrate cross-section views during various steps of a first method embodiment of the present invention. The process begins in FIG. 1a, wherein a substrate 102 having a first mask 104 formed thereon is shown. The substrate 102 is preferably a bulk semiconductor substrate doped with a dopant of a first conductivity type, preferably having a (100) or (111) surface orientation. The first mask 104 is preferably formed over the substrate 102 to protect areas of the substrate 102 from a subsequent etching process to form concave structures as discussed below.

It should be noted that while embodiments of the present invention are described in the context of using a bulk silicon substrate, other substrates may be used. For example, silicon-on-insulator (SOI) substrates, sapphire substrates, SiC substrates, and the like may also be used. Embodiments of the present invention, however, may be particularly suited to silicon substrates due to the low cost in addition to reducing the residual stress in the LED structure formed thereon. Silicon substrates may also improve the extraction efficiency and allow a selective group III-N epitaxial growth process to be used.

The first mask 104 is preferably a hard mask comprising one or more dielectric layers. In an embodiment, the first mask 104 comprises a silicon dioxide layer formed by, for example, thermal oxidation or by chemical vapor deposition (CVD) techniques using tetra-ethyl-ortho-silicate (TEOS) and oxygen as a precursor, or a silicon nitride layer formed using CVD techniques using silane and ammonia as precursor gases. Alternatively, the first mask 104 may be formed of other dielectric materials. For example, silicon oxynitride, or the like may also be used. A multi-layer hard mask, such as layers of silicon dioxide and silicon nitride, may also be used. Furthermore, other materials, such as a metal, a metal nitride, a metal oxide, or the like may be used. For example, the first mask 104 may be formed of tungsten.

Figure 1A:
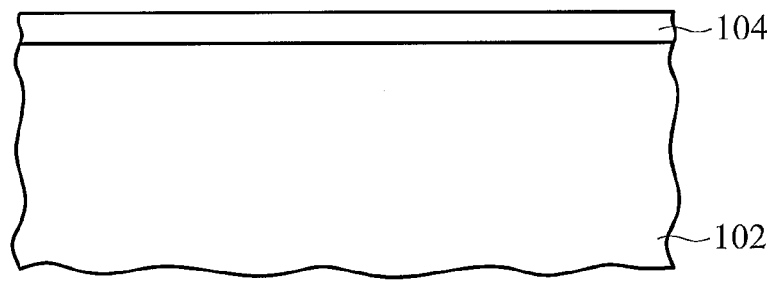
FIGS. 1a-1f are cross-section views of a first method of forming LED structures in accordance with an embodiment of the present invention.
Figure 1B:
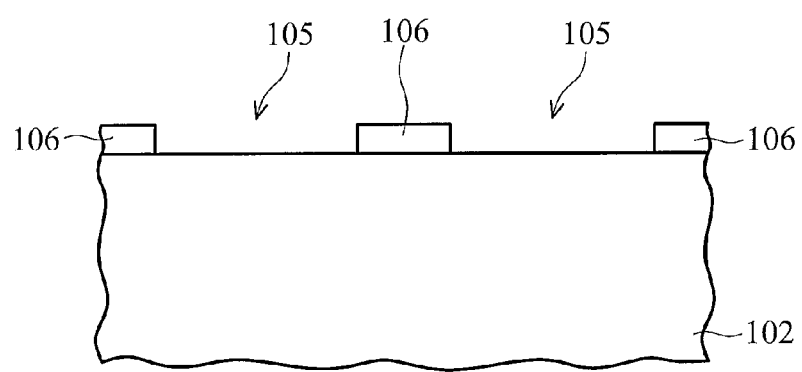

As illustrated in FIG. 1b, the first mask 104 is subsequently patterned to form a patterned first mask 106 in accordance with an embodiment of the present invention. In an embodiment, the first mask 104 is patterned using photolithography techniques known in the art. Generally, photolithography techniques involve depositing a photoresist material and irradiating the photoresist material in accordance with a pattern. Thereafter, the photoresist material is developed to remove a portion of the photoresist material. The remaining photoresist material protects the underlying material during subsequent processing steps, such as etching. In this case, the photoresist material is utilized to create a patterned mask to define openings 105 (which will become concave recesses in the substrate 102 as discussed below).

Figure 1C:
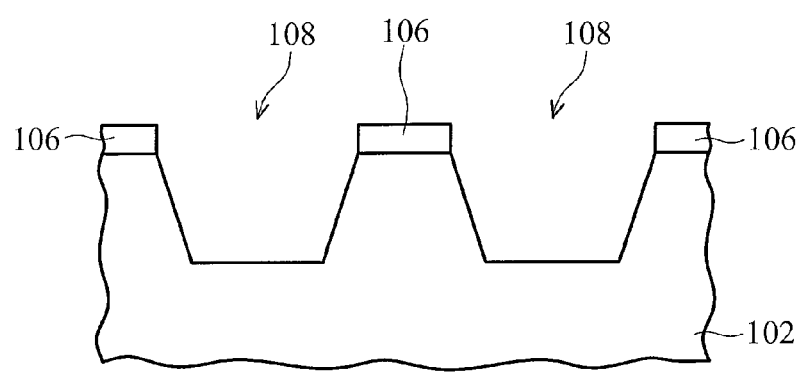

FIG. 1c illustrates the result of an etching step to form concave recesses 108 in accordance with an embodiment of the present invention. During this etching process, the patterned first mask 106 protects the underlying substrate 102 from the etch process. As a result, the unprotected portions of the substrate 102 are removed, thereby forming the concave recesses 108. In an embodiment, the etching process is performed at least in part by a wet dip in dilute potassium hydroxide (KOH). The concave recesses 108 are preferably about 0.1 μm to about 100 μm wide and about 0.1 μm to about 10 μm deep. Other etching processes, including dry etch processes (e.g., inductively-coupled plasma (ICP) etching, reactive ion etching (RIE), and the like) and/or wet etch processes (e.g., chemical etching, photo-enhance chemical etching, and the like) may be used. It should be noted that the concave recesses 108 may be of any shape, such as a pyramid, tapered, cylindrical, semisphere, column, rectangular, or the like.

Figure 1D:
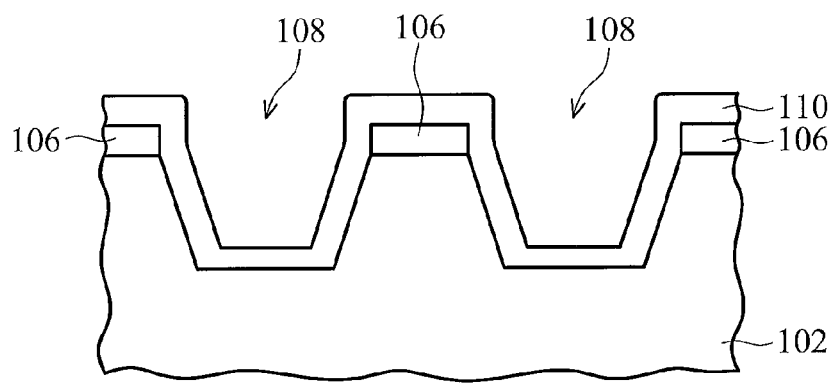

Next, a separation layer 110 is formed in accordance with an embodiment of the present invention as illustrated in FIG. 1d. The separation layer 110 preferably includes a dielectric material blanket deposited over the substrate 102. A metal nitride or other material having a high resistivity, such as AlN that has a resistivity greater than about $10^{14}$ ohm-cm, may also be used for the separation layer 110. It should be noted that the materials selected for the first mask 104 and the separation layer 110 are preferably selected such that there is a good etch selectivity between the materials for the different layers for subsequent processing. For example, in an embodiment in which the first mask 104 is formed of silicon dioxide, the separation layer 110 may be a silicon nitride. In this embodiment, the separation layer 110 may be etched using thermal phosphoric acid at about 120° C., which has a selective etch rate between silicon nitride and silicon dioxide of greater than about 100. The separation layer 110 is preferably about 5 nm to about 3000 nm in thickness.

Figure 1E:
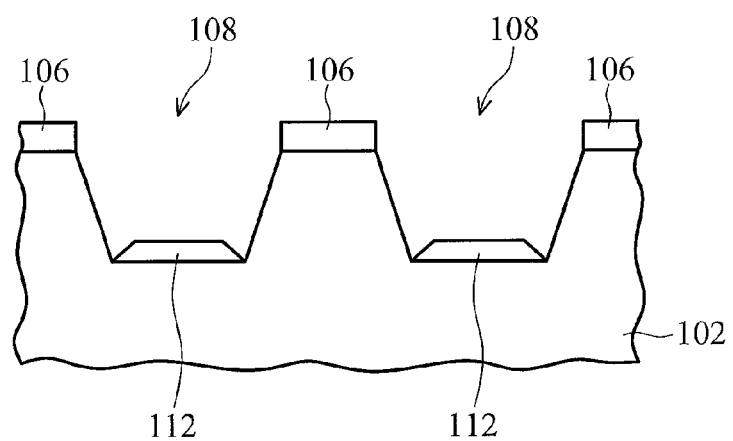

The separation layer 110 is patterned as illustrated in FIG. 1e such that the separation layer 110 is removed except for a portion along the bottom surfaces of the concave recesses 108, thereby forming separation regions 112. The separation layer 110 may be patterned using photolithography techniques as described above. In this case, a photoresist material may be deposited, exposed, and developed such that the photoresist material remains over the separation layer 110 along the bottom of the concave recesses 108. An etch process, such as an anisotropic dry etch process, may be used to remove the unprotected separation layer 110. The remaining portions of the separation layer 110 form the separation regions 112 as illustrated in FIG. 1e.

Figure 1F:
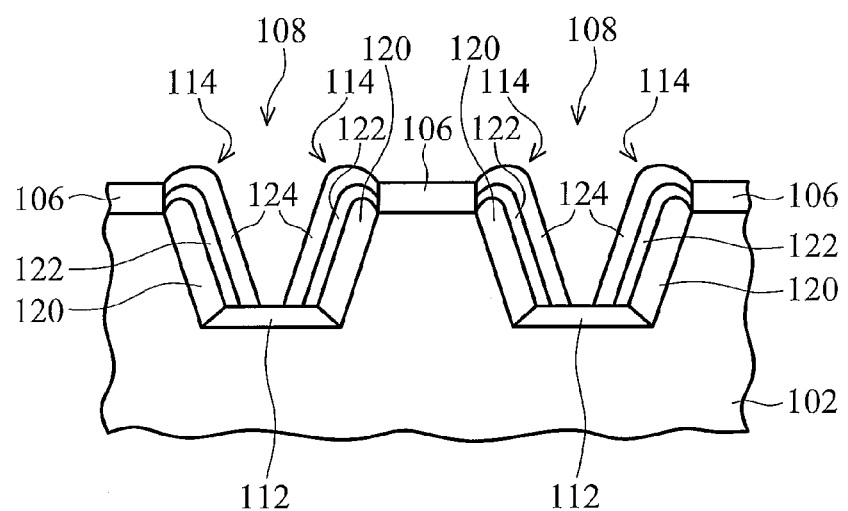

Thereafter, LED structures 114 may be formed as illustrated in FIG. 1f in accordance with an embodiment of the present invention. The LED structures 114 are formed along the sidewalls of the concave recesses 108, preferably being separated along the bottom of the concave recesses 108 by the separation regions 112. In this manner, the separation regions 112 act to reduce the residual stress during an epitaxial growth process of the LED structures 114. While the LED structures 114 may extend over the separation regions 112, it is expected that the residual stress in the LED structures 114 will be diminished.

The LED structures 114 may comprise any LED structure suitable for a particular application. Generally, the LED structures 114 include a first contact layer 120 formed over sidewalls of the concave recesses 108 in the substrate 102. Preferably, the first contact layer 120 is formed of a group III-N compound doped with a dopant of the first conductivity type (e.g., n-GaN) and may be disposed by, for example, a selective epitaxial growth process such as a molecular-beam epitaxy (MBE), metal organic chemical vapor deposition (MOCVD), Hydride Vapor Phase Epitaxy (HVPE), liquid phase epitaxy (LPE), or the like. The group III-N material may include, for example, GaN, InN, AlN, $In_xGa_{(1-x)}$, $Al_xGa_{(1-x)}N$, $Al_xIn_yGa_{(1-x-y)}N$, or the like.

Active layer 122 is disposed on the first contact layer 120. The active layer 122 may comprise multiple quantum wells (MQW) and acts as an active layer for emitting light. MQW structures in active layer 122, may be layers of InGaN and GaN, for example. MQWs in active layer 122 may be disposed in an epitaxial reactor.

A second contact layer 124 is disposed on the active layer 110. The second contact layer 124 is preferably formed of a group III-N compound doped with a dopant of the second conductivity type (e.g., p-GaN) and may be formed by a process similar to the first contact layer 120.

Thereafter, processes may be performed to complete the LED device. For example, electrical contacts (front-side and/or backside contacts) may be formed to the first and second contact layers 120 and 124, passivation layers may be formed, and the LED device may be diced and packaged.

It should be noted that the above description describes a method of forming concave recesses in a substrate, in which LED devices may be formed. Other layers, such as a distributed Bragg reflector or a buffer layer, may be desirable. Depending upon the type of substrate and the connections to the first and second contact layers 120 and 124, a buffer layer may also be desirable between the first contact layer 120 and the substrate 102. For example, with some types of substrates, such as SiC substrates, a buffer layer, such as AlN or AlGaN, may be desirable to aid in the selective epitaxial growth of a group III-N compound on the SiC substrate. A distributed Bragg reflector generally comprises multiple layers having different refractive indices that cause light emitted from the LED structures to be reflected, thereby increasing the light emitted from the top of the LED device. A reflective buffer layer may also be used with or in place of the distributed Bragg reflector.

The structure of the LED structures 114 may also vary depending on the type of materials used and the intended application. It is expected that many types of LED structures may be used with embodiments of the present invention, which provides concave recesses in a substrate in which LED structures may be formed.

Advantageously, one of ordinary skill in the art will realize that due to the non-planar surface of the LED structures 114, the total area of active layer 122 is advantageously increased as compared to a planar MQW occupying the same chip area. As a result, the light emitting efficiency is increased.

It should also be noted that the above description assumes a backside contact for the first contact layer 120, which typically uses a doped substrate 102. In situations in which a front-side contact is utilized to provide an electrical contact to the first contact layer 120, an undoped substrate 102 may be used.

Figure 2A:
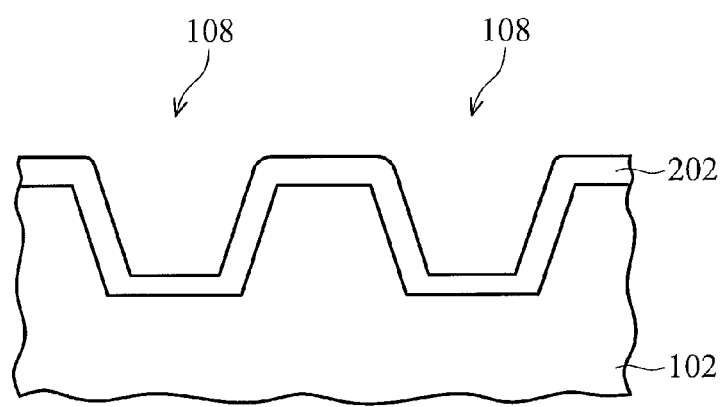
FIGS. 2a-2c are cross-section views of a second method of forming LED structures in accordance with an embodiment of the present invention.
Figure 2B:
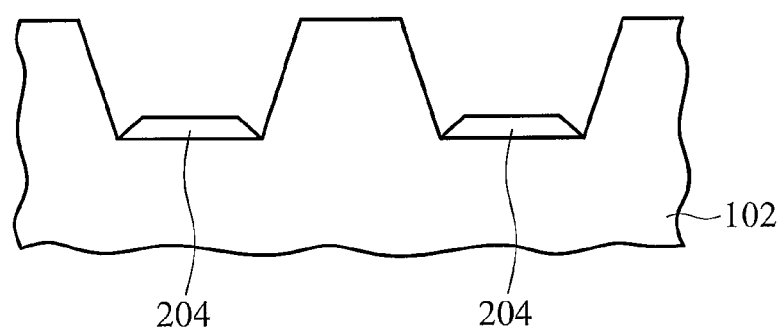
Figure 2C:
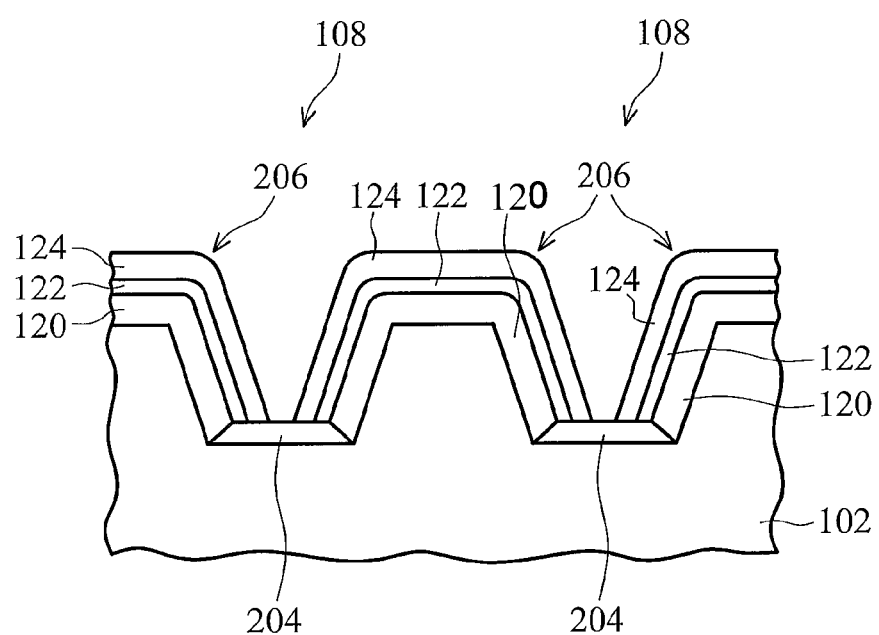

FIGS. 2a-2c illustrate cross-section views during various steps of a second method embodiment of the present invention. The process illustrated in FIGS. 2a-2c assumes processes, materials, and structures similar to those discussed above with reference to FIGS. 1a-1c, wherein like reference numerals refer to like elements.

Referring now to FIG. 2a, which illustrates an intermediate process step subsequent to FIG. 1c, the patterned first mask 106 (see FIG. 1c) is removed and a separation layer 202 is formed in accordance with an embodiment of the present invention. The patterned first mask 106 may be removed, for example, by a wet dip in a dilute hydrofluoric acid.

Thereafter, the separation layer 202 is formed as a conformal layer over the surface of the substrate 102. The separation layer 202 is preferably a dielectric layer, such as silicon dioxide that may be formed in a manner similar to the separation layer 110 discussed above with reference to FIG. 1d.

FIG. 2b illustrates the patterning of the separation layer 202 to form the separation regions 204. The separation layer 202 is patterned to form separation regions 204 along the bottom of the concave recesses 108. The separation regions 204 may be formed using photolithography techniques and an etch process, such as an anisotropic dry etch process, as discussed above with reference to FIG. 1e.

Thereafter, as illustrated in FIG. 2c, the LED structures 206 may be formed in the same manner as the LED structures 114, except that the LED structures 206 overlay a top surface of the substrate 102 between adjacent concave recesses 108. Because the patterned first mask 106 (see FIG. 1c) has been removed, thereby exposing the underlying substrate, the LED structures 206, which are formed by selective epitaxial growth, will be formed on the top exposed surface of the substrate 102 between the concave recesses 108 as well as on the exposed sidewalls of the concave recesses 108. In this manner, an even greater amount of surface area of the LED structures 206 is created. As a result the light emitted efficiency is increased as compared to a planar surface or the embodiment described above with reference to FIG. 1f.

Figure 3:
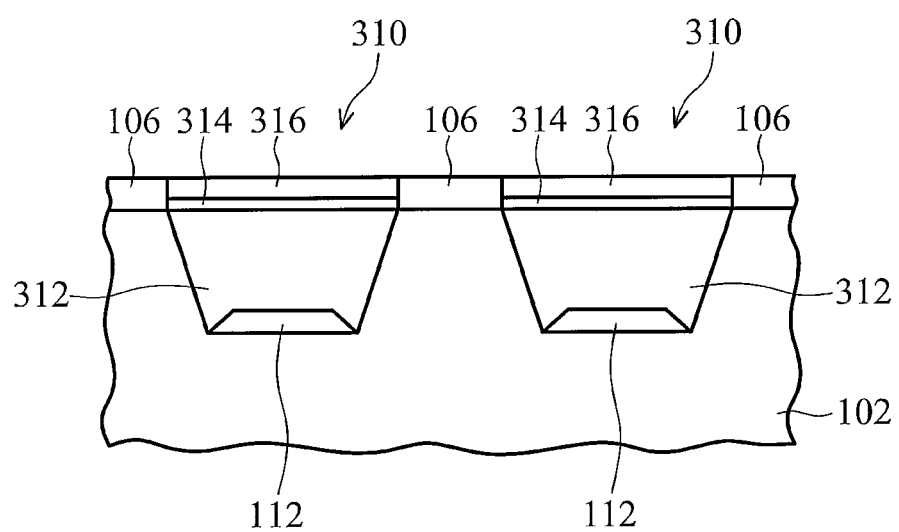
FIG. 3 is a cross-section view of a third method of forming LED structures in accordance with an embodiment of the present invention.

FIG. 3 illustrates cross-section views during various steps of a third method embodiment of the present invention. The process illustrated in FIG. 3 assumes processes, materials, and structures similar to those discussed above with reference to FIGS. 1a-1e, wherein like reference numerals refer to like elements.

Referring now to FIG. 3, which illustrates a process step subsequent to FIG. 1e, a planar LED structure 310 is formed within the concave recesses 108, substantially filling the recesses. In this embodiment, the LED structure 310 is preferably formed using processes that result in a first contact layer 312 having a non-conformal surface relative to the underlying substrate 102. In a preferred embodiment, the top surface of the first contact layer is planar, and even more preferably, the top surface of the first contact layer is co-planar with the top surface of the substrate 102. For example, in an embodiment in which an n-GaN/MQW/p-GaN LED structure is utilized, the n-GaN layer for the first contact layer 312 may be formed by, for example, a metal organic vapor phase epitaxy process by placing the substrate in reaction chamber of a MOVPD apparatus heated to about 1,000° C., wherein hydrogen, ammonia, and trimethyl gallium (TMGa) are supplied in the reaction chamber. In order to form n-type doped GaN, silane ($SiH_4$) is also introduced into the reaction chamber. A pressure in the reaction chamber of about 40 torr may be used. An active layer 314 and a second contact layer 316 (e.g., a p-GaN layer) may be formed using processes similar to those discussed above with reference to the active layer 122 and the second contact layer 124, respectively, wherein bis-cyclopentadienylmagnesium ($CP_2Mg$) is provided in the reaction chamber instead of silane to form p-GaN.

In this embodiment, it should be noted that the patterned first mask 106 may optionally be removed. Furthermore, if the patterned first mask remains and comprises a metal or other conductive material, then it is preferred that the first contact layer 312 extend above the patterned first mask 106 to prevent a short condition between the first contact layer 312 and the second contact layer 316.

One of ordinary skill in the art will appreciate that while this embodiment has a first contact layer and an active layer with less surface area than the embodiments discussed above with reference to FIGS. 1a-1f and 2a-2c, the use of a recessed substrate may result in an epitaxial GaN layer having a cubic structure with a non-polar characteristic. This arrangement may allow a higher external quantum efficiency than may be achieved with a planar layer of GaN formed along a surface of a substrate.

It should also be noted that because the separation regions 112 are completely covered with the first contact layer 312 in this embodiment, the separation regions 112 may be formed with a dielectric material, metal, or a metal nitride.

Figure 4:
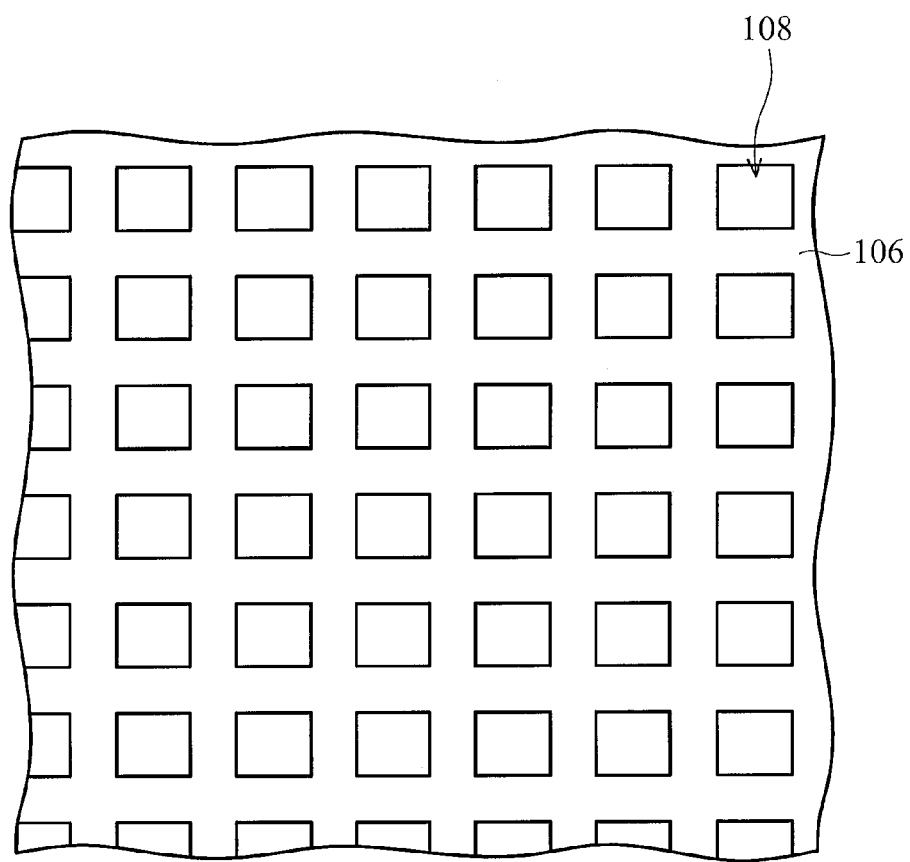
FIGS. 4 and 5 are plan views of examples of patterns that may be used in accordance with embodiments of the present invention.
Figure 5:
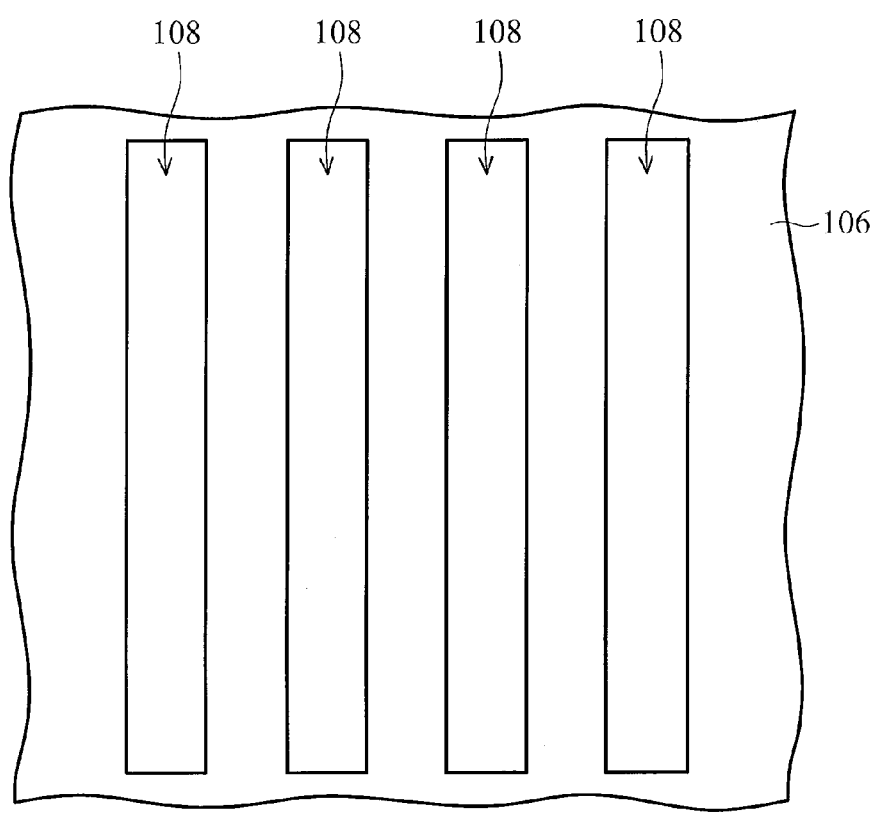

FIGS. 4 and 5 are plan views that illustrate patterns that may be used in accordance with embodiments of the present invention. It should be noted that the patterns are provided for illustrative purposes only, and that the pattern may be of any shape, size, and pattern that is particularly well-suited for a particular application. Referring first to FIG. 4, the patterned first mask 106 (see FIG. 1b) is patterned in a grid shape. As a result, the LED structures (e.g., LED structures 114 and 206 of FIGS. 1f and 2c, respectively) will be formed in a matrix or grid of recesses. FIG. 5 illustrates another embodiment in which the LED structures 114 and 206 are arranged in parallel lines.

In the foregoing specification, the invention has been described with reference to specific embodiments. However, various modifications and changes can be made by one skilled in the art without departing from the scope of the present invention. Accordingly, the specification and figures are to be regarded in an illustrative rather than a restrictive sense, and all such modifications are intended to be included within the scope of the present invention.

For example, while the present invention has been illustrated with reference to an n-type substrate and an LED structure having top-to-bottom layers comprising n-GaN, active layer, and p-GaN, an LED structure having top-to-bottom layers comprising p-GaN, active layer, and n-GaN may be used. Additionally, other types of materials besides GaN may be used. In this embodiment, the substrate may be, for example, a p-type substrate (desirable with backside electrical contacts) or an undoped substrate (desirable with a front-side electrical contacts).

One of ordinary skill in the art will appreciate that embodiments of the present invention allow the capability for integrating silicon-based semiconductor devices with LED structures while reducing costs by, for example, using a bulk silicon substrate. The use of the silicon substrate further allows the use of selective epitaxial growth for the LED device and reduces residual stress in the LED device. The use of recesses in the substrate also allows the surface area of LED structure to be increased, thereby increasing the emission area and light efficiency. Embodiments using a non-conformal or planar contact and active layers, such as the embodiment discussed above with reference to FIG. 3, allows a cubic structure of the group III-N layer, which exhibits a higher external quantum efficiency.

Although particular embodiments of the invention have been described in detail, it is understood that the invention is not limited correspondingly in scope, but includes all changes, modifications, and equivalents coming within the spirit and terms of the claims appended hereto. For example, differing types of materials and differing thicknesses may be used, and the like. Accordingly, it is understood that this invention may be extended to other structures and materials, and thus, the specification and figures are to be regarded in an illustrative rather than a restrictive sense.

What is claimed is:

1. A light-emitting diode (LED) device comprising:
   a substrate;
   recesses in the substrate;
   mask portions over the substrate, each of the mask portions being between adjacent ones of the recesses;
   separation regions, each of the separation regions being along a bottom of one of the recesses, the separation regions having a different material composition than the mask portions; and
   LED structures, each of the LED structures (i) being within and adjoining the substrate along a sidewall of one of the recesses and a portion of the LED structure adjoining the sidewall having a different material composition than the substrate in the sidewall, (ii) extending over at least a portion of an upper surface of a respective one of the separation regions and adjoining a sidewall of the respective one of the separation regions, and (iii) abutting a lateral surface of a respective mask portion.

2. The LED device of claim 1, wherein at least two LED structures are within a first one of the recesses, the at least two LED structures being formed along opposing sidewalls of the first one of the recesses and being separated along the bottom of the first one of the recesses forming separate LED structures.

3. The LED device of claim 1, wherein each of the LED structures comprises a first contact layer along the sidewall, an active layer over the first contact layer, and a second contact layer over the active layer.

4. The LED device of claim 3, wherein the first contact layer has a non-conformal surface.

5. The LED device of claim 3, wherein the first contact layer has a substantially planar surface and fills the recesses.

6. The LED device of claim 1, wherein the LED structures and the mask portions have top surfaces that are substantially co-planar.

7. The LED device of claim 1, wherein the separation regions comprise a dielectric material, a metal nitride, a first material having a resistivity greater than $10^{14}$ ohm-cm, or a combination thereof.

8. A light-emitting diode (LED) device comprising:
   a substrate having recesses formed therein;
   a mask over the substrate;
   a separation layer in the recesses, the separation layer having a different material composition than the mask; and
   LED structures formed in the recesses, the LED structures adjoining respective sidewalls of the recesses, extending over a portion of the separation layer, adjoining a sidewall of the separation layer, and abutting a lateral surface of the mask, the substrate having a different material composition in the sidewalls than respective portions of the LED structures adjoining the sidewalls.

9. The LED device of claim 8, wherein the separation layer adjoins the substrate along bottoms of the recesses.

10. The LED device of claim 8, wherein each of the LED structures comprises:
    a first contact layer formed along a sidewall of a respective recess;
    an active layer formed over the first contact layer; and
    a second contact layer formed over the active layer.

11. The LED device of claim 8, wherein the separation layer comprises a dielectric material, a metal nitride, a first material having a resistivity greater than $10^{14}$ ohm-cm, or a combination thereof.

12. The LED device of claim 8, wherein the mask has a first lateral surface aligned with a first one of the recesses and a second lateral surface aligned with a second one of the recesses.

13. The LED device of claim 8, wherein the LED structures have a planar surface.

14. The LED device of claim 8, wherein the LED structures have a top surface conforming to the recesses.

15. A light-emitting device (LED) comprising:
    a substrate;
    a recess in the substrate;
    a separation layer along a bottom surface of the recess, the separation layer comprising a dielectric material, a first material having a resistivity greater than $10^{14}$ ohm-cm, or a combination thereof;
    a mask layer over the substrate, the mask layer having a different material composition than the separation layer;
    a first contact layer over sidewalls of the recess and adjoining the substrate, the first contact layer having a different material composition than the substrate in the sidewall;
    an active layer over the first contact layer; and
    a second contact layer over the active layer, at least one of the first contact layer, the active layer, and the second contact layer abutting a side surface of the mask layer, at least one of the first contact layer, the active layer, and the second contact layer extending over the separation layer.

16. The LED device of claim 15, wherein the substrate has a (100) surface orientation.

17. The LED device of claim 15, wherein the first contact layer has a planar surface.

18. The LED device of claim 15, wherein the first contact layer has a uniform thickness over the sidewalls of the recess.

19. The LED device of claim 15, wherein the mask layer and the second contact layer have upper surfaces that are substantially co-planar.

* * * * *